United States Patent
Cai

(10) Patent No.: US 10,361,262 B2
(45) Date of Patent: Jul. 23, 2019

(54) OLED DISPLAY DEVICE AND PIXEL DRIVING CIRCUIT THEREOF

(71) Applicant: Shenzhen China Star Optoelectronics Semiconductor Display Technology Co., Ltd., Shenzhen, Guangdong (CN)

(72) Inventor: Yuying Cai, Guangdong (CN)

(73) Assignee: Shenzhen China Star Optoelectronics Semiconductor Display Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 15/766,877

(22) PCT Filed: Sep. 28, 2017

(86) PCT No.: PCT/CN2017/104027
§ 371 (c)(1),
(2) Date: Apr. 9, 2018

(87) PCT Pub. No.: WO2019/033516
PCT Pub. Date: Feb. 21, 2019

(65) Prior Publication Data
US 2019/0074341 A1    Mar. 7, 2019

(51) Int. Cl.
*H01L 27/32* (2006.01)
*G09G 3/3266* (2016.01)
*G09G 3/3275* (2016.01)

(52) U.S. Cl.
CPC ....... *H01L 27/3262* (2013.01); *G09G 3/3266* (2013.01); *G09G 3/3275* (2013.01); *H01L 27/3265* (2013.01)

(58) Field of Classification Search
CPC ............ H01L 27/3262; H01L 27/3265; G09G 3/3266; G09G 3/3275
USPC .......................................................... 345/204
See application file for complete search history.

(56) References Cited

U.S. PATENT DOCUMENTS

| | | | |
|---|---|---|---|
| 2011/0102418 A1 | 5/2011 | Park | |
| 2015/0379934 A1* | 12/2015 | Xiaoling | G09G 3/3233 345/214 |

FOREIGN PATENT DOCUMENTS

| | | |
|---|---|---|
| CN | 101488319 A | 7/2009 |
| CN | 102074189 A | 5/2011 |
| CN | 105761678 A | 7/2016 |
| CN | 105761679 A | 7/2016 |
| CN | 106205495 A | 12/2016 |

* cited by examiner

*Primary Examiner* — Amare Mengistu
*Assistant Examiner* — Gloryvid Figueroa-Gibson
(74) *Attorney, Agent, or Firm* — Andrew C. Cheng

(57) ABSTRACT

A pixel driving circuit using 4T1C pixel structure applied in an OLED display device is provided. The OLED display device senses a threshold voltage imposed on the TFT when the OLED display device is powered off or powered on and compensates the threshold voltage which is sensed in normal operating display for the driving current of the OLED, thereby reducing the influence of the threshold voltage imposed on the TFT on the driving current of the OLED and improving the display quality of the OLED display device.

12 Claims, 11 Drawing Sheets

OLED DISPLAY DEVICE AND PIXEL DRIVING CIRCUIT THEREOF

BACKGROUND

1. Field of the Disclosure

The present disclosure relates to the field of display technology, and more particularly, to a pixel driving circuit for an organic light-emitting diode (OLED) display device and the OLED display device with the pixel driving circuit.

2. Description of the Related Art

Recently, an organic light-emitting diode (OLED) display device has been a very popular and new flat display product worldwide because the OLED display device has features of auto-luminescence, wide viewing angles, short response time, high luminous efficacy, wide color gamut, low operating voltage, small thickness, potential to produce a display device with large sizes and flexibility, and simple manufacturing process. Besides, the OLED display device costs less to a larger extent.

The TFT with a capacitor storage signal controls the brightness and grayscale of the OLED in the OLED display device. To achieve the goal of the constant current driving, each of the pixels needs to be formed by two or more TFTs and a storage capacitor, that is, a 2T1C mode. FIG. 1 is a circuit diagram of a pixel driving circuit arranged in an OLED display device of related art. As FIG. 1 illustrates, the pixel driving circuit of the OLED display device of related art includes two TFTs and a capacitor. Specifically, the pixel driving circuit includes a switching TFT T1, a driving TFT T2, and a storing capacitor Cst. The driving current flowing through the OLED is controlled by the driving TFT T2. The current measures $I_{OLED}=k(V_{gs}-V_{th})^2$ where k indicates an intrinsic conducting factor of the driving TFT T2 and determined by the characteristics of the driving TFT T2; $V_{th}$ indicates a threshold voltage of the driving TFT T2; $V_{th}$ indicates the voltage imposed on a gate and a source of the driving TFT T2. The threshold voltage Vth of the driving TFT T2 drifts in the long-time operation so the driving current flowing through the OLED changes, thereby causing poor display of the OLED display device and affecting the quality of display images.

SUMMARY

To solve the technology of the related art, an object of the present disclosure is to propose a pixel driving circuit and an organic light-emitting diode (OLED) display device with the pixel driving circuit. The pixel driving circuit is arranged in the OLED display device and can diminish the threshold voltage imposed on a thin-film transistor (TFT) which affects the driving current flowing through the OLED.

According to a first aspect of the present disclosure, a pixel driving circuit for an organic light-emitting diode (OLED) display device includes a first thin-film transistor (TFT), a second TFT, a third TFT, a fourth TFT, a capacitor, and an OLED. The first TFT includes a gate electrically connected to a first node, a source electrically connected to a second node, and a drain electrically connected to a first supply voltage. The second TFT includes a gate receiving a second scanning signal and a drain electrically connected to the first node. The third TFT includes a gate receiving a first scanning signal and a drain electrically connected to the first node. The fourth TFT includes a gate receiving a third scanning signal and a drain electrically connected to the second node. The capacitor is electrically connected between the first node and the second node. The OLED includes an anode electrically connected to the second node and a cathode electrically connected to a second supply voltage. When the OLED display device is powered off or powered on, a source of the second TFT receives the first data signal. A source of the third TFT and a source of the fourth TFT receive an initialized signal or a threshold voltage sensor. The threshold voltage sensor is configured to sense a threshold voltage of the first TFT and generate a threshold voltage signal. When the OLED display device operates normally, the source of the second TFT receives a second data signal formed by a combination of the threshold voltage signal and a raw data signal. The source of the third TFT and the source of the fourth TFT receive the initialized signal. The initialized signal and the first data signal are both at constantly low voltage level. The raw data signal is at single-pulse high voltage level.

Furthermore, the pixel driving circuit performs a reset operation and a threshold voltage sensing operation when the OLED display device is powered off or powered on.

Furthermore, when the pixel circuit performs the reset operation, the first scanning signal is at low voltage level, the second scanning signal and the third scanning signal are both at high voltage level, the first data signal is at low voltage level, and the source of the third TFT and the source of the fourth TFT receive the initialized signal.

Furthermore, when the pixel circuit performs the threshold voltage sensing operation, the first scanning signal is at low voltage level, the second scanning signal and the third scanning signal are both at high voltage level, the first data signal is at low voltage level, and the source of the third TFT and the source of the fourth receive the threshold voltage sensor.

Furthermore, the pixel driving circuit performs the reset operation, a threshold voltage sensing operation, a threshold voltage compensating operation, and a driving operation when the OLED display device is in normal display.

Furthermore, when the pixel circuit performs the reset operation, the first scanning signal and the third scanning signal are at high voltage level, the second scanning signal is at low voltage level, and the second data signal is a sum of the reference signal at low voltage level and the threshold voltage signal.

Furthermore, when the pixel circuit performs the threshold voltage sensing operation, the first scanning signal and the third scanning signal are at low voltage level, the second scanning signal is at high voltage level, and the second data signal is a sum of the reference signal at low voltage level and the threshold voltage signal .

Furthermore, when the pixel circuit performs the threshold voltage compensating operation, the first scanning signal and the third scanning signal are both are low voltage level, the second scanning signal is at high voltage level, and the second data signal is a sum of the display data signal at high voltage level and the threshold voltage signal.

Furthermore, when the pixel driving circuit performs the driving operation, the first scanning signal and third scanning voltage are at low voltage level, the second scanning signal at low voltage level, and the second data signal is the sum of the reference signal at low voltage level and the threshold voltage signal.

In a second aspect of the present disclosure, an organic light-emitting diode (OLED) display device comprising the pixel driving circuit as provided above.

The present disclosure has beneficiary effects as follows. The OLED display device senses a threshold voltage imposed on the TFT when the OLED display device is powered off or powered on and compensates the threshold voltage which is sensed in normal operating display for the driving current of the OLED, thereby reducing the influence of the threshold voltage imposed on the TFT on the driving current of the OLED and improving the display quality of the OLED display device.

BRIEF DESCRIPTION OF THE DRAWINGS

The invention is described below in detail with reference to the accompanying drawings, wherein like reference numerals are used to identify like elements illustrated in one or more of the figures thereof, and in which exemplary embodiments of the invention are shown.

DETAILED DESCRIPTION OF THE EMBODIMENTS

Figure 1:
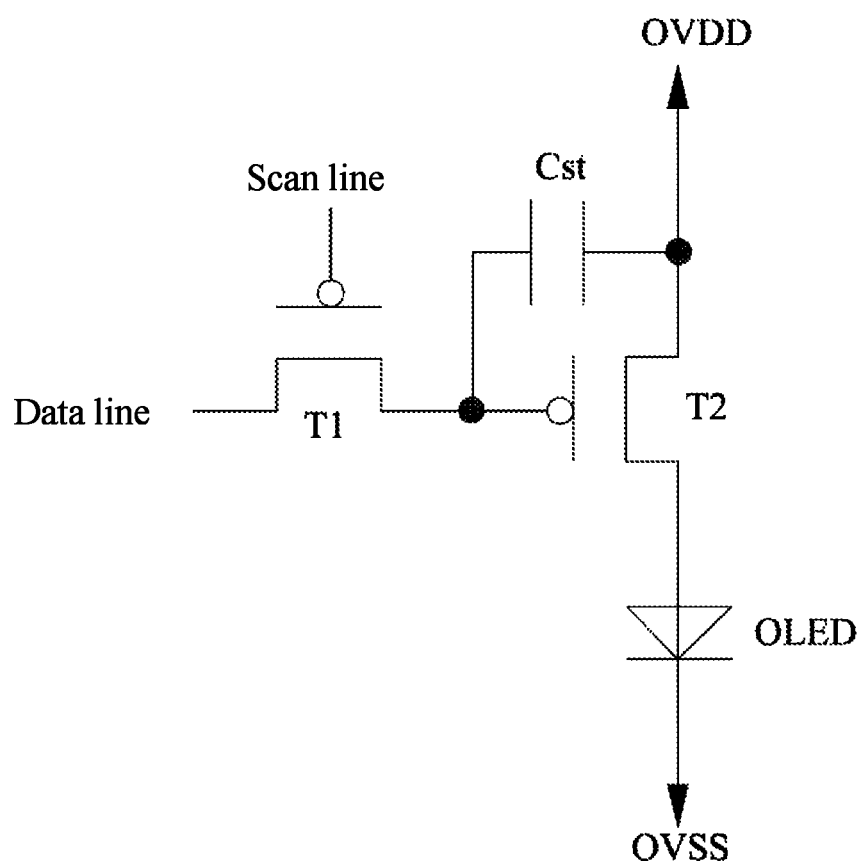
FIG. 1 is a circuit diagram of a pixel driving circuit arranged in an OLED display device of related art.

Embodiments of the present application are illustrated in detail in the accompanying drawings, in which like or similar reference numerals refer to like or similar elements or elements having the same or similar functions throughout the specification. The embodiments described below with reference to the accompanying drawings are exemplary and are intended to be illustrative of the present application, and are not to be construed as limiting the scope of the present application.

In the drawings, thickness of layers and areas is exaggerated for clarify. In addition, the same element illustrated in drawings is labeled as the same number.

Figure 2:
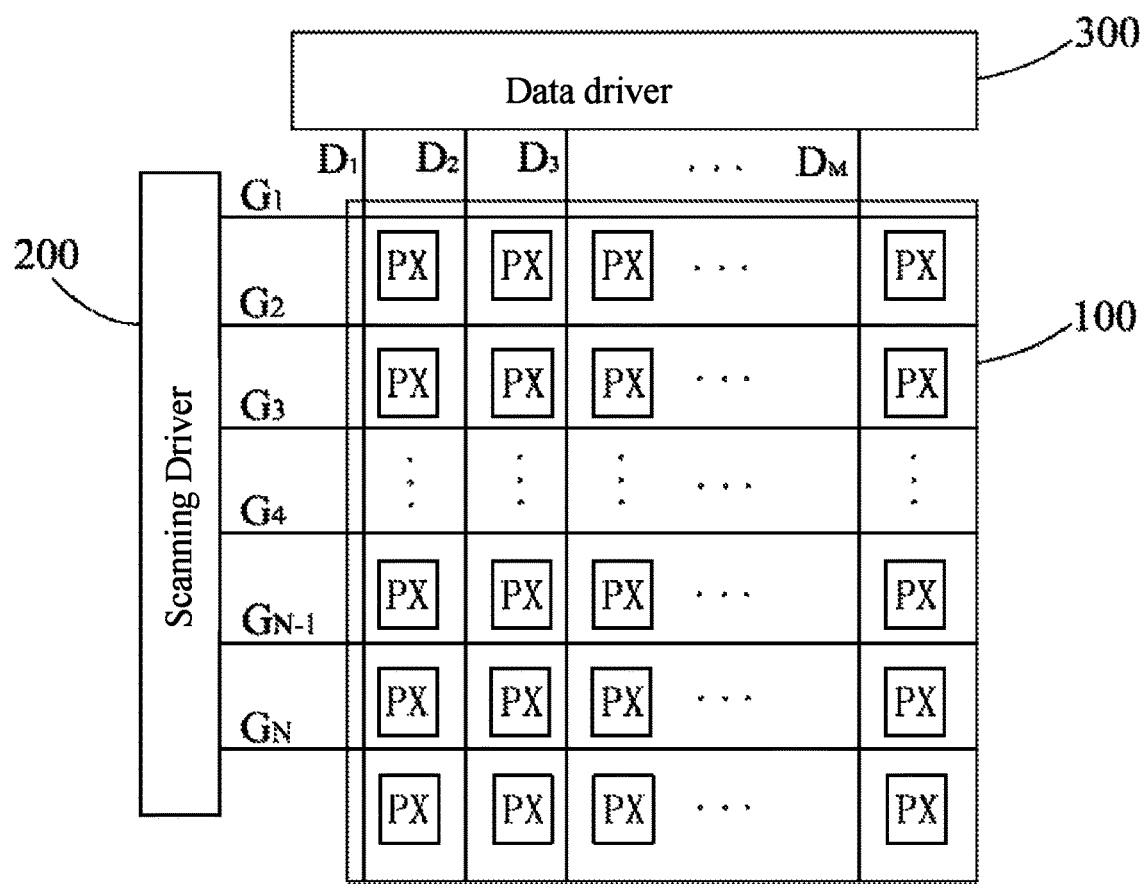
FIG. 2 illustrates a schematic diagram of an organic light-emitting diode (OLED) display device according to a first embodiment of the present disclosure.

Please refer to FIG. 2 illustrating a schematic diagram of an organic light-emitting diode (OLED) display device according to a first embodiment of the present disclosure.

Please refer to FIG. 2. The OLED display device includes a display panel 100, a scanning driver 200, and a data driver 300. The OLED display device further includes other proper devices such as a timing controller which controls the scanning driver 200 and the data driver 300, a power voltage generator which supplies power positive electrode voltage and power negative electrode voltage, etc.

Specifically, the display panel 100 includes a plurality of pixels PX arranged in an array, N scanning lines $G_1$ to $G_N$, and M data lines $D_1$ to $D_M$. The scanning driver 200 is connected to the scanning lines $G_1$ to $G_N$ and drives the scanning lines $G_1$ to $G_N$. The data driver 300 connected to the data lines $D_1$ to $D_M$ drives the data lines $D_1$ to $D_M$.

Each of the plurality of pixels PX may be supplied with a scanning signal or a plurality of scanning signals by the scanning driver 200. Each of the plurality of pixels PX may be supplied with a data signal by the data driver 300. Both of them will be detailed later.

Each of the pixels PX includes a pixel driving circuit. The pixel driving circuit proposed by the present disclosure is detailed as follows.

Figure 3:
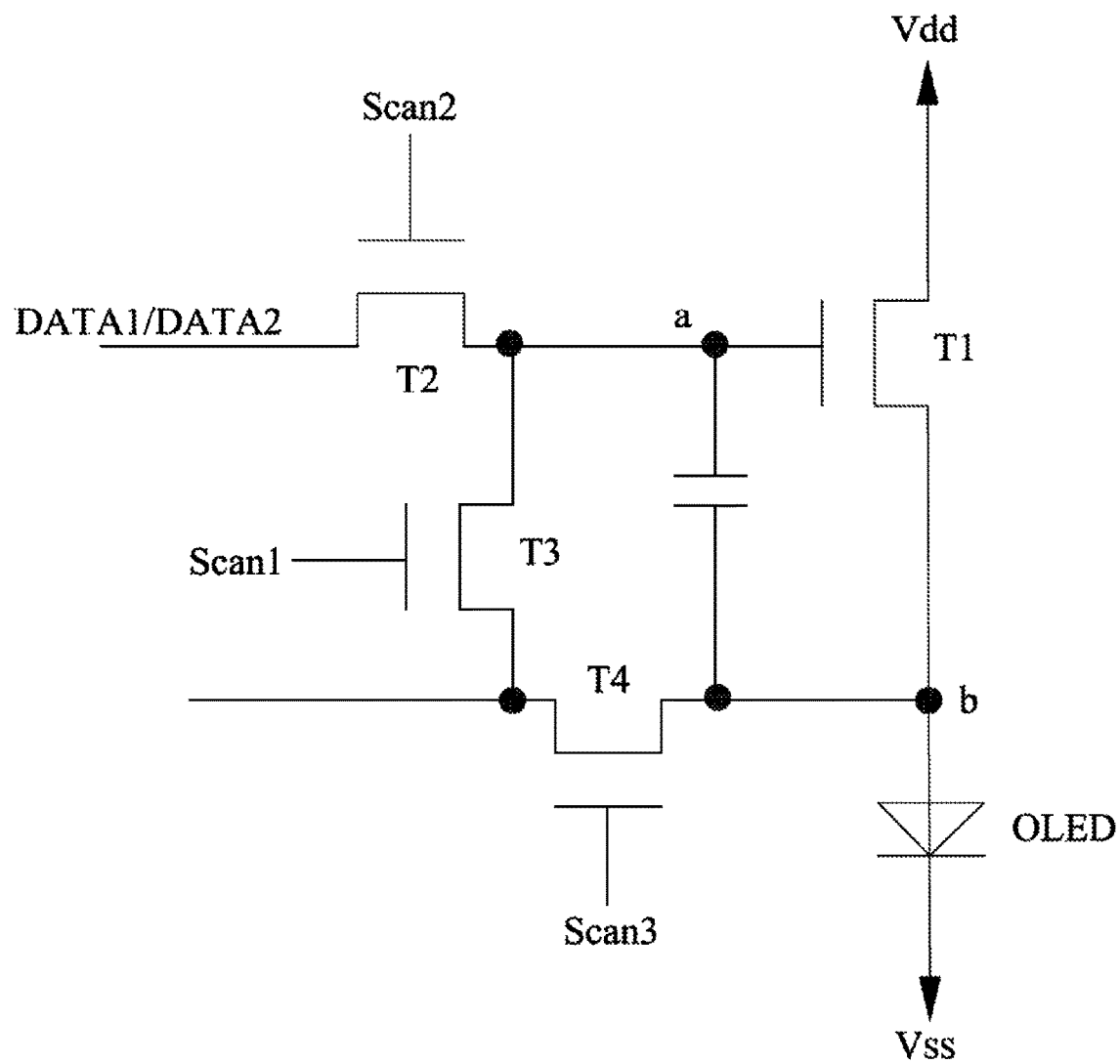
FIG. 3 illustrates an equivalence circuit diagram of the pixel structure of the OLED display device according to the first embodiment of the present disclosure.

Please refer to FIG. 3 illustrating an equivalence circuit diagram of the pixel structure of the OLED display device according to the first embodiment of the present disclosure.

Please refer to FIG. 3. The structure of each of the pixels PX is a 4T1C pixel according to the present embodiment of the present disclosure. The 4T1C pixel includes an organic light-emitting diode (OLED), a first thin-film transistor (TFT) T1, a second TFT T2, a third TFT T3, a fourth TFT T4, and a capacitor C.

A gate of the first TFT T1 is electrically connected to a first node a. A source of the first TFT T1 is electrically connected to a second node b. A drain of the first TFT T1 is electrically connected to a first supply voltage Vdd.

A gate of the second TFT T2 receives a second scanning signal Scan2. A drain of the second TFT T2 is electrically connected to the first node a.

A gate of the third TFT T3 receives a first scanning signal Scan1. A drain of the third TFT T3 is electrically connected to the first node a.

A gate of the fourth TFT T4 receives a third scanning signal Scan3. A drain of the fourth TFT T4 is electrically connected to the second node b.

A terminal of the capacitor C is electrically connected to the first node a, and another terminal of the capacitor C is electrically connected to the second node b.

An anode of the OLED is electrically connected to the second node b. A cathode of the OLED is electrically connected to a second supply voltage Vss.

The first TFT T1 is a driving TFT.

When the OLED display device is powered off or powered on (or the predetermined time after the OLED display device is powered off or powered on), a source of the second TFT T2 receives a first data signal DATA1, and a source of the third TFT T3 and a source of the fourth TFT T4 receive an initialized signal INI or a threshold voltage sensor 400. The threshold voltage sensor 400 is configured to sense the threshold voltage Vth of the first TFT T1 and generate a threshold voltage signal. The operating process of the threshold voltage sensor 400 is detailed in the following.

When the OLED display device operates normally (i.e., from the time when the display device is turned on or the predetermined time after the display device is turned on to the time when the display device is turned off), the source of the second TFT T2 receives the second data signal DATA2 formed by a combination of the threshold voltage signal and the raw data signal. The source of the third TFT T3 and the source of the fourth TFT T4 receive the initialized signal INI.

Figure 4:
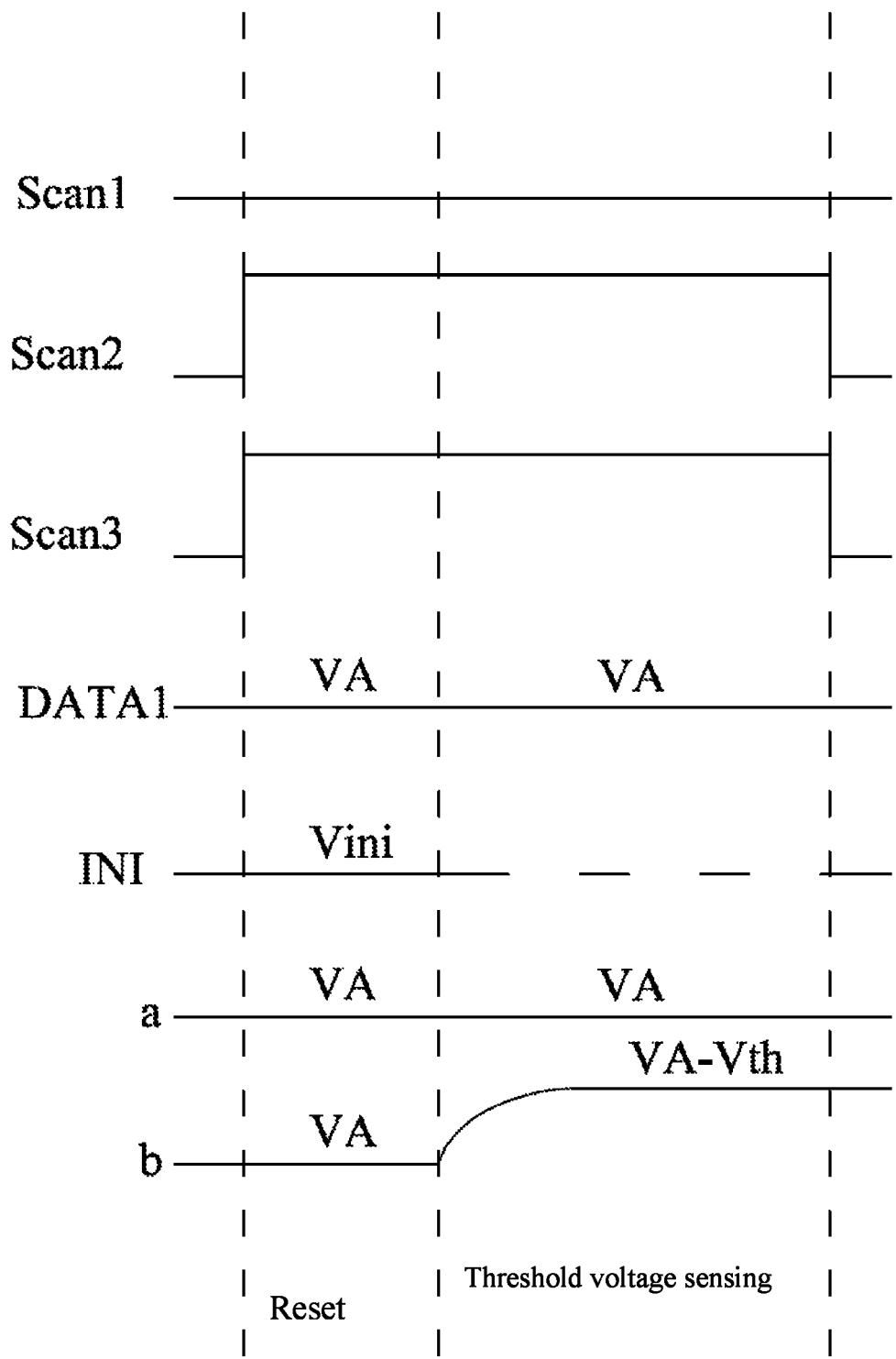
FIG. 4 is a timing diagram of each of the operating stages of the pixel driving circuit when being turned off or on according to the embodiment of the present disclosure.
Figure 5A:
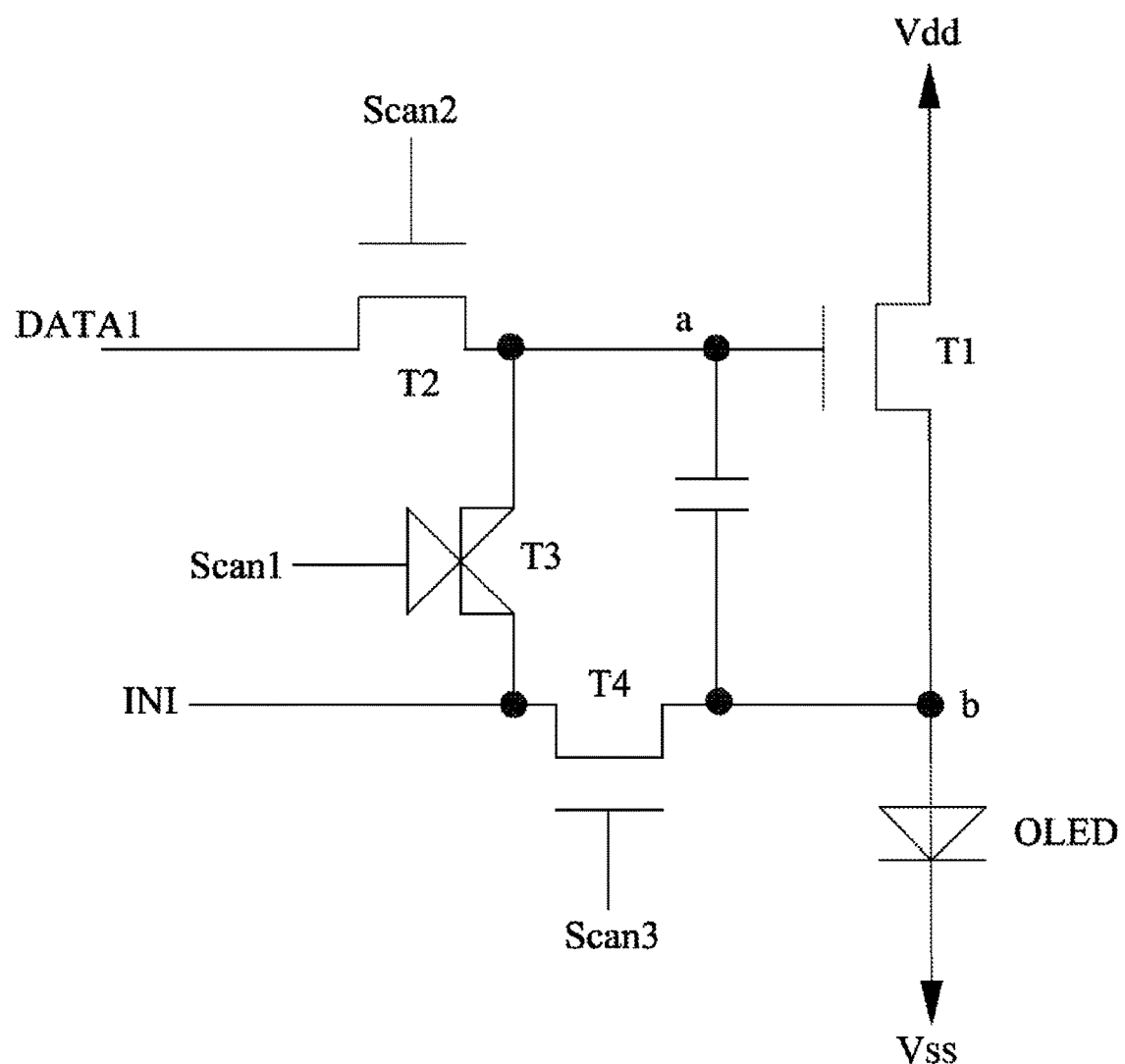
FIGS. 5A and FIG. 5B are operating flowcharts of the pixel driving circuit when being turned off or on according to the embodiment of the present disclosure.

In the reset stage, as FIG. 4 and FIG. 5A illustrate, the first scanning signal Scan1 is at low voltage level. The second scanning signal Scan2 and the third scanning signal Scan3 are both at high voltage level. The first data signal DATA1 is at low voltage level VA. The source of the third TFT T3 and the source of the fourth TFT T4 receive the initialized signal INI. The initialized signal INI is at low voltage level Vini. At this time, the third TFT T3 is turned off. The second TFT T2 and the fourth TFT T4 are both turned on. The voltage imposed on the first node a is Va=VA and the voltage imposed on the second b node is Vb=Vini, resulting in Vini=VA, which completes initialization.

Figure 5B:
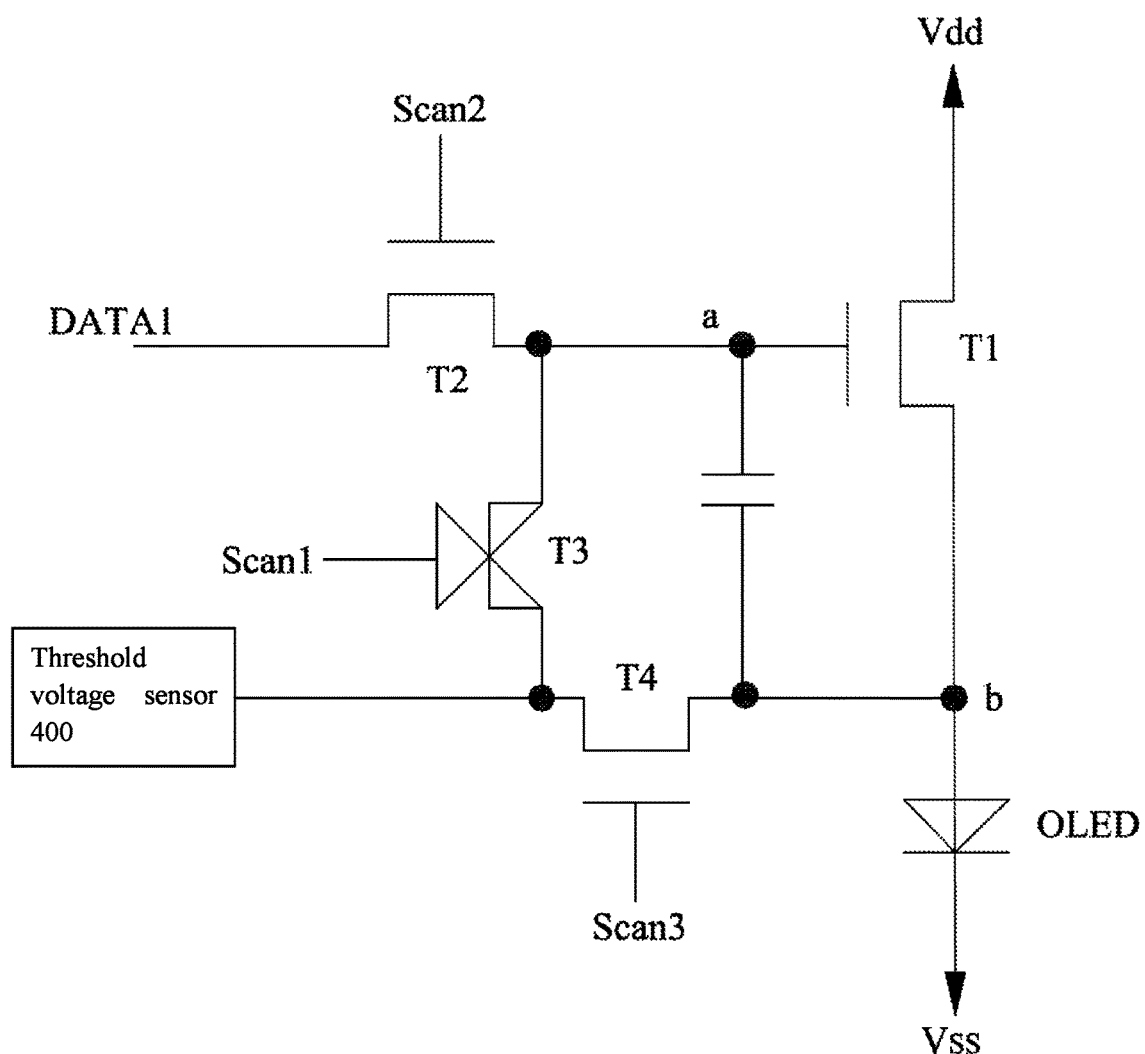

At the threshold voltage sensing stage, as FIG. 4 and FIG. 5B illustrate, the first scanning signal Scan1 is at low voltage level; the second scanning signal Scan2 and the third scanning signal Scan3 are both at high voltage level; the first data signal DATA1 is at low voltage level VA; the source of the third TFT T3 and the source of the fourth TFT T4 receives the threshold voltage sensor 400. At this time, the third TFT T3 is turned off, and the second TFT T2 and the fourth TFT T4 are both turned on. The voltage imposed on the first node a is Va=VA and the voltage imposed on the second node b is Vb=VA−Vth, so the voltage sensed with the threshold voltage sensor 400 is VA−Vth where Vth is the threshold voltage imposed on the first TFT T1. Further, the threshold voltage Vth is obtained after the threshold voltage sensor 400 calculates internally. For example, the threshold voltage is the deduction of the voltage VA and the sensed voltage. Afterwards, the threshold voltage sensor 400 feedbacks the obtained threshold voltage Vth, which will be detailed in the following.

Figure 6:
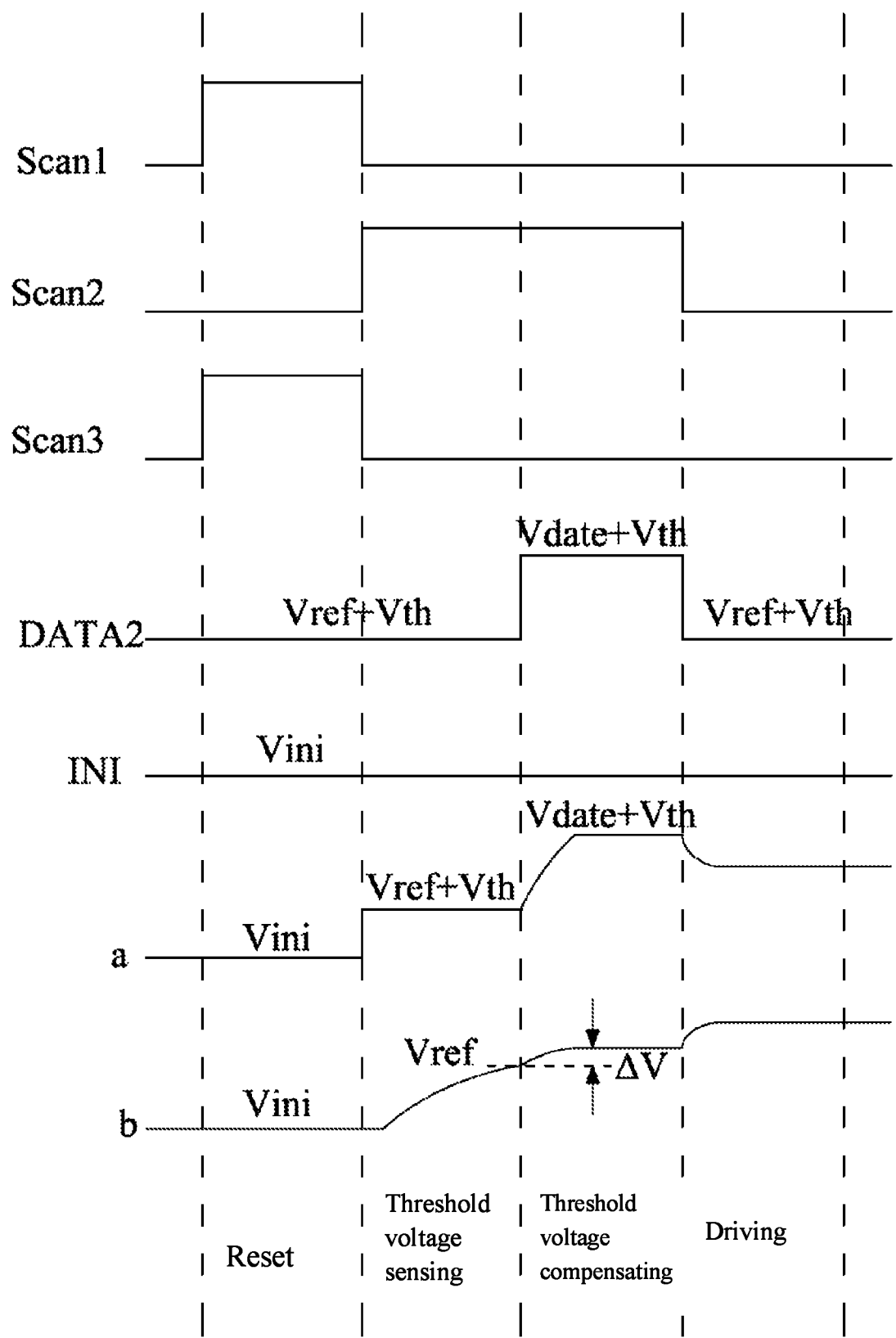
FIG. 6 is a timing diagram of each of the operating stages of the pixel driving circuit in normal display according to the embodiment of the present disclosure.

The operating principle of the pixel driving circuit in normal display proposed by the present embodiment of the disclosure is elaborated as follows. The pixel driving circuit with the 4T1C pixel structure performs a reset operation (i.e., reset stage), a threshold voltage sensing operation (i.e., threshold voltage sensing stage), a threshold voltage compensating operation (i.e., threshold voltage compensating stage), and a driving operation (i.e., driving emitting stage) in normal display. FIG. 6 is a timing diagram of each of the operating stages of the pixel driving circuit in normal display according to the embodiment of the present disclosure. FIG. 7A to FIG. 7D are a set of operating flowchart of the pixel driving circuit in normal display according to the embodiment of the present disclosure. The cross symbol (x) on the TFT, as FIG. 7A to FIG. 7D illustrate, means that the TFT stays turned off.

Figure 7A:
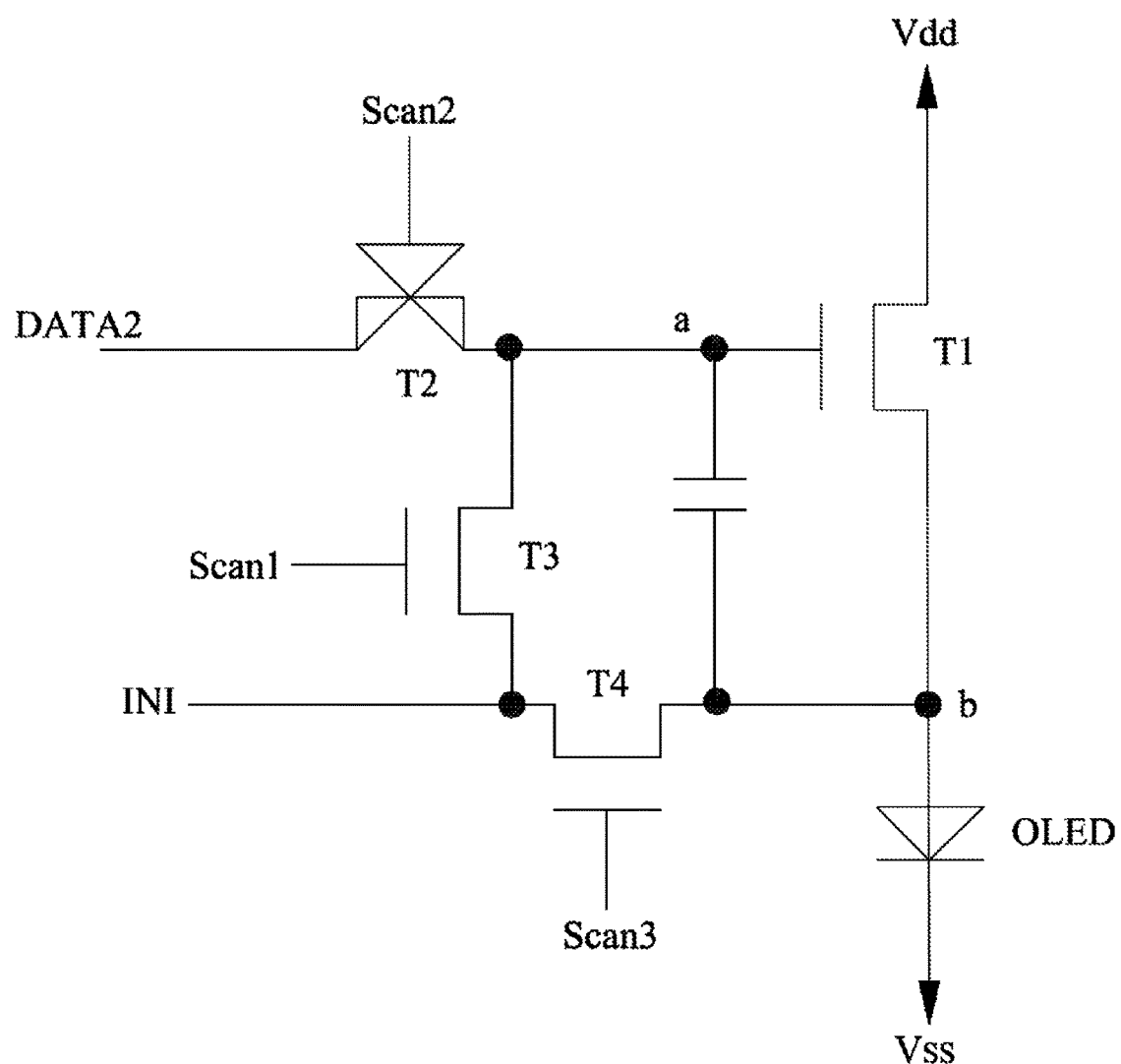
FIGS. 7A to FIG. 7D are operating flowcharts of the pixel driving circuit in normal display according to the embodiment of the present disclosure.

At the reset stage, as FIG. 6 and FIG. 7A illustrate, the first scanning signal Scan1 and the third scanning signal Scan3 are both at high voltage level; the second scanning signal Scan2 is at low voltage level; the second data signal DATA2 is the sum of the reference signal Vref at low voltage level and the threshold voltage signal Vth. The source of the third TFT T3 and the source of the fourth TFT T4 receive the initialized signal INI. At this time, the second TFT T2 is turned off; the third TFT T3 and the fourth TFT T4 are both turned on; the initialized signal INI at constantly low voltage level is written to the first node a (i.e., the gate of the first TFT T1) through the third TFT T3; the initialized signal INI at constantly low voltage level is written to the second node b (i.e., the source of the first TFT T1) through the fourth TFT T4; the gate and the source of the first TFT Ti are initialized to clear off the remaining data; the first TFT T1 is turned off; the OLED does not emit light.

At the reset stage,

Vg=Va=Vini

Vs=Vb=Vini

Vg indicates the gate voltage level of the first TFT T 1. Va indicates the voltage level of the first node a. Vs indicates the source voltage level of the first TFT T1. Vb indicates the voltage level of the second node b. Vini indicates the constantly low voltage level of the initialized signal INI.

Figure 7B:
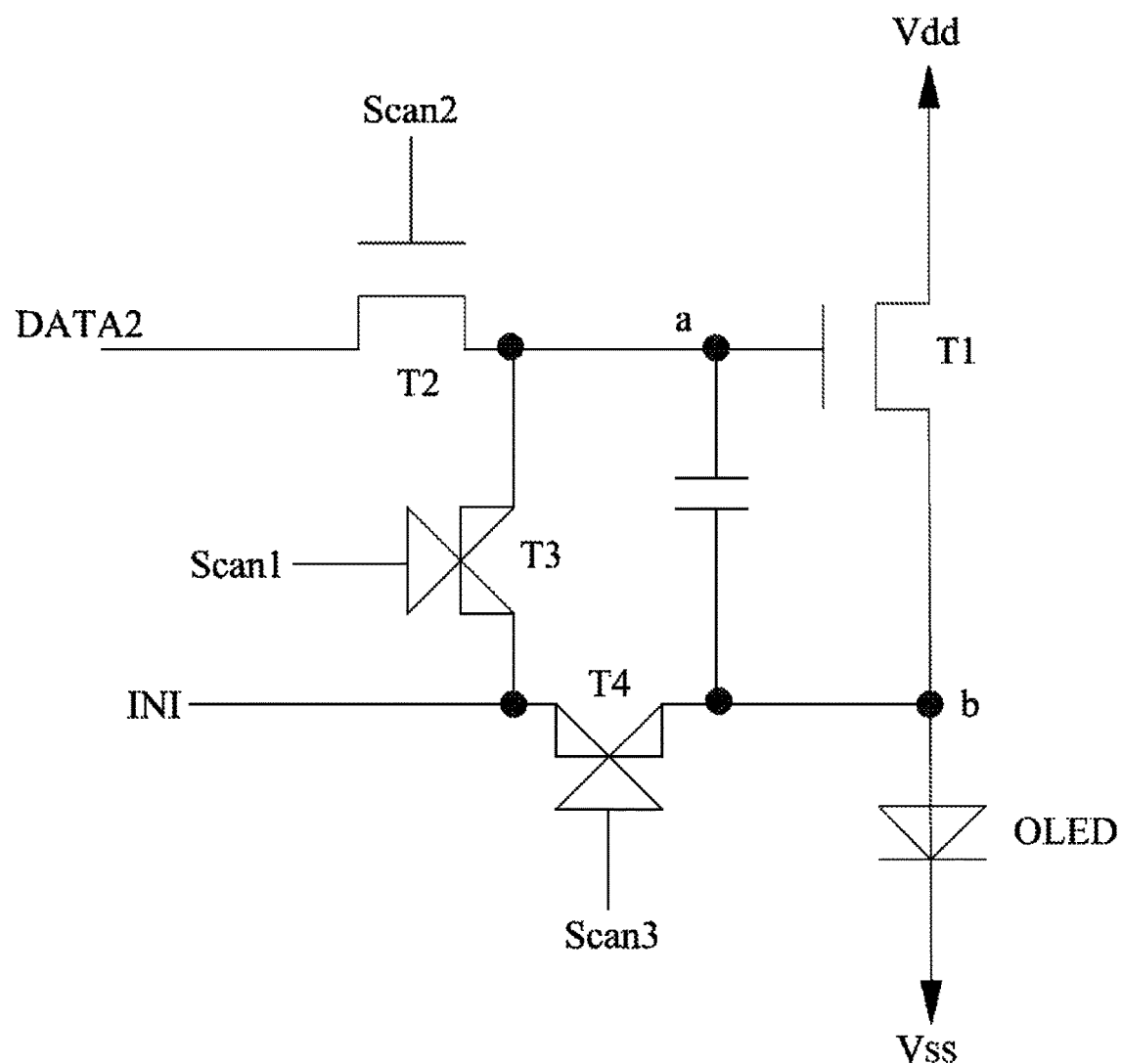

At the threshold voltage sensing stage, as FIG. 6 and FIG. 7B illustrate, the first scanning signal Scan1 and the third scanning signal Scan3 are both at low voltage level; the second scanning signal Scan2 is at high voltage level; the second data signal DATA2 is the sum of the reference signal Vref at low voltage level and the threshold voltage signal Vth; the source of the third TFT T3 and the source of the fourth TFT T4 receive the initialized signal INI. At this time, the second TFT T2 is turned on; the third TFT T3 and the fourth TFT T4 are both turned off; the first node a (i.e., the gate of the first TFT T1) is written to the sum of the reference signal Vref at low voltage level and the threshold voltage signal Vth (that is, the second data signal DATA2); the voltage level of the second node b (i.e., the source of the first TFT T1) is turned into Vref.

At the threshold voltage sensing stage,

Vg=Va=Vref+Vth

Vs=Vb=Vref

Figure 7C:
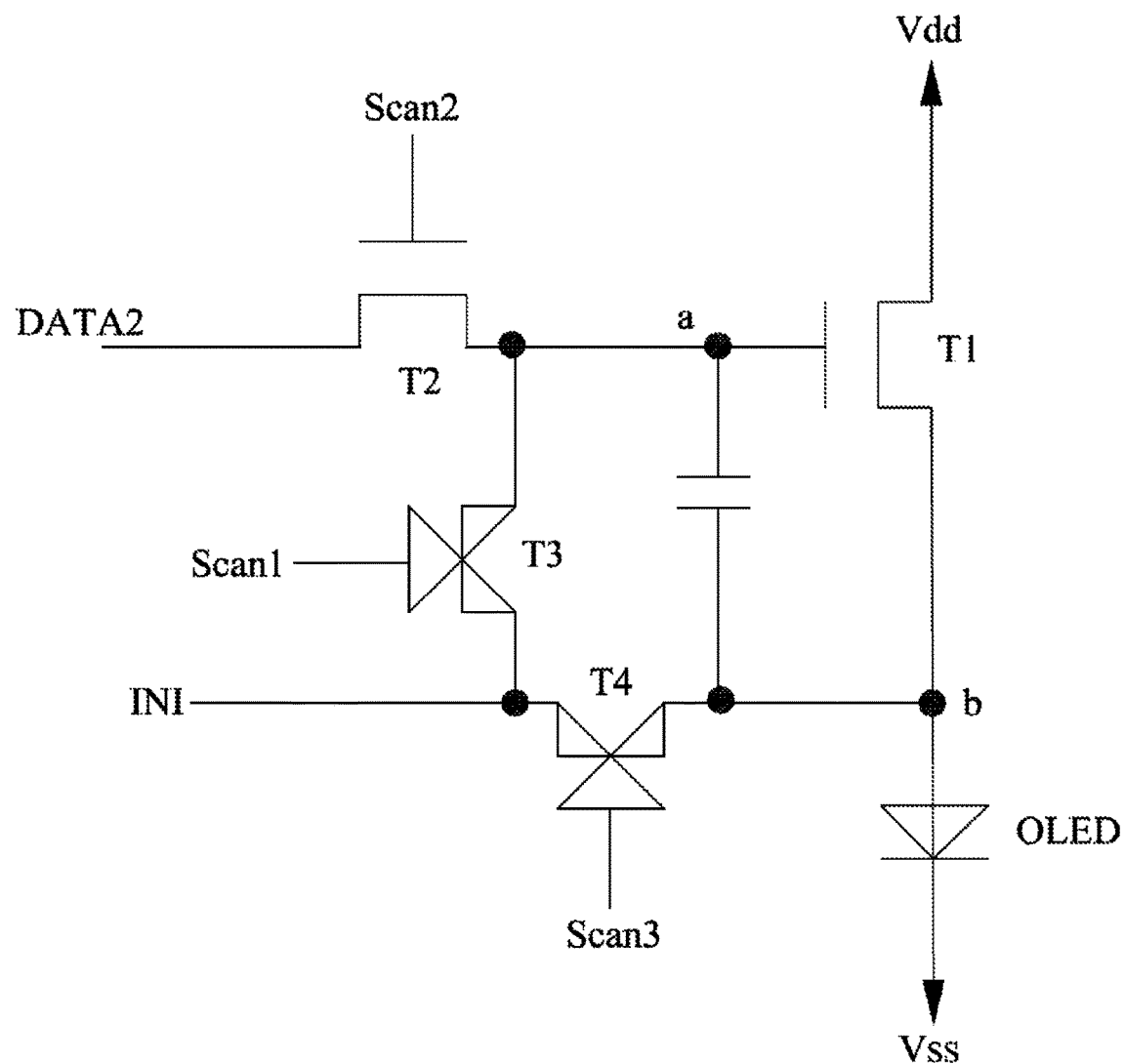

At the threshold voltage compensating stage, as FIG. 6 and FIG. 7C illustrates, the first scanning signal Scan1 and the third scanning signal Scan3 are both at low voltage level; the second scanning signal Scan2 is at high voltage level; the second data signal DATA2 is the sum of the display data signal Vdata at high voltage level and the threshold voltage signal of Vth. The source of the third TFT T3 and the source of the fourth TFT T4 receive the initialized signal INI. At this time, the third TFT T3 and the fourth TFT T4 are both turned off; the second TFT T2 is turned on; the second data signal DATA2 writes the sum of the display data signal Vdata at high voltage level and the threshold voltage signal of Vth to the first node a (i.e., the gate of the first TFT T1) and the capacitor C through the second TFT 2; the voltage level of the second node b (i.e., the source of the first TFT T1) is turned into Vref+ΔV. ΔV represents the influence of the display data signal Vdata at high level on the voltage level of the source of the first TFT T1 (i.e., the second node b). So the influence is irrelevant to the threshold voltage Vth of the first TFT T1.

At the threshold voltage compensating stage,

Vg=Va=Vdata+Vth

Vs=Vb=Vref+ΔV

So the difference Vgs between the gate voltage Vg imposed on the first TFT T1 and the source voltage Vs imposed on the first TFT T1 is Vgs=Vg−Vs=Vdata+Vth−Vref−ΔV.

Figure 7D:
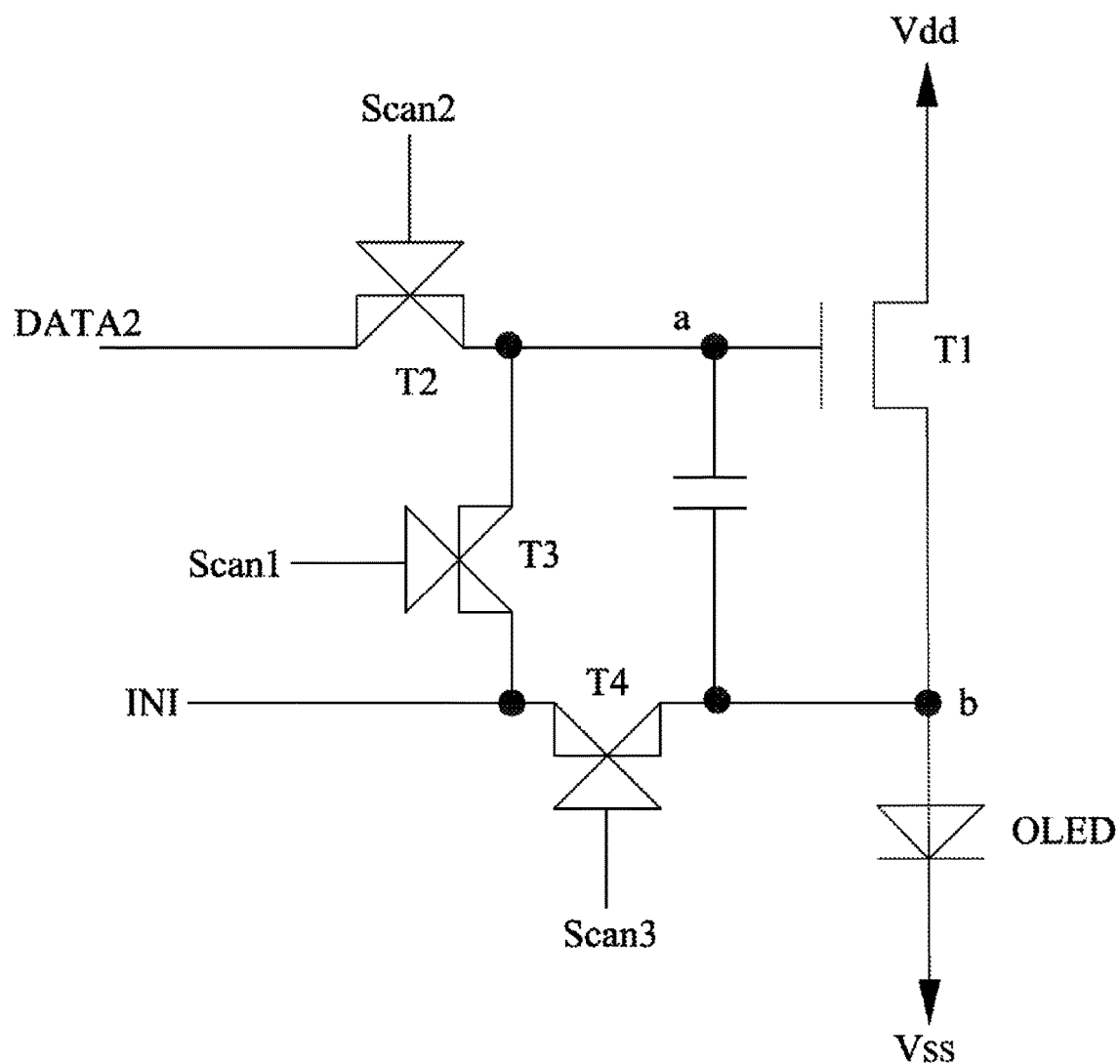

At the driving emitting stage, as FIG. 6 and FIG. 7D illustrate, the first scanning signal Scan1, the second scanning signal Scan2 and the third scanning signal Scan3 are all at low voltage level; the second data signal DATA2 is the sum of the reference signal Vref at low voltage level and the threshold voltage signal Vth; the source of the third TFT T3 and the source of the fourth TFT T4 both receive the initialized signal INI. At this time, the second TFT T2, the third TFT T3, and the fourth TFT T4 are all turned off. The difference Vgs between the first node a (i.e., the voltage level of the gate of the first TFT T1) and the second node b (i.e., the voltage level of the source of the first TFT T1) maintains the same because of storage of the capacitor C.

Further, the current I flowing the OLED is $I=K(Vgs-Vth)^2=K(V\text{data}-V\text{ref}-\Delta V+Vth-Vth)^2=K(V\text{data}-V\text{ref}-\Delta V)^2,$ where K indicates an intrinsic conducting factor of the first TFT T1. The intrinsic conducting factor is determined by the characteristics of the first TFT T1.

As the equation of the current I flowing the OLED shows, the current I is irrelevant to the threshold voltage Vth of the first TFT T1. In other words, the phenomenon of poor image display due to the drift of the threshold voltage Vth of the first TFT T1 is completely cleared.

Above are embodiments of the present invention, which does not limit the scope of the present invention. Any modifications, equivalent replacements or improvements within the spirit and principles of the embodiment described above should be covered by the protected scope of the invention.

What is claimed is:

1. A pixel driving circuit for an organic light-emitting diode (OLED) display device, comprising:
    a first thin-film transistor (TFT), comprising a gate electrically connected to a first node, a source electrically connected to a second node, and a drain electrically connected to a first supply voltage;
    a second TFT, comprising a gate receiving a second scanning signal and a drain electrically connected to the first node;
    a third TFT, comprising a gate receiving a first scanning signal and a drain electrically connected to the first node;
    a fourth TFT, comprising a gate receiving a third scanning signal and a drain electrically connected to the second node;
    a capacitor, electrically connected between the first node and the second node;
    an OLED, comprising an anode electrically connected to the second node and a cathode electrically connected to a second supply voltage;
    wherein when the OLED display device is powered off or powered on, a source of the second TFT receives a first data signal, a source of the third TFT and a source of the fourth TFT receive an initialized signal or a threshold voltage sensor, the threshold voltage sensor is configured to sense a threshold voltage of the first TFT and generate a threshold voltage signal;
    when the OLED display device operates normally, the source of the second TFT receive a second data signal formed by a combination of the threshold voltage signal and a raw data signal, the source of the third TFT and the source of the fourth TFT receive the initialized signal;
    wherein the initialized signal and the first data signal are both at constantly low voltage level, and the raw data signal is at single-pulse high voltage level.

2. The pixel driving circuit of claim 1, wherein the pixel driving circuit performs a reset operation and a threshold voltage sensing operation when the OLED display device is powered off or powered on.

3. The pixel driving circuit of claim 2, wherein when the pixel circuit performs the reset operation, the first scanning signal is at low voltage level, the second scanning signal and the third scanning signal are both at high voltage level, the first data signal is at low voltage level, and the source of the third TFT and the source of the fourth TFT receive the initialized signal.

4. The pixel driving circuit of claim 3, wherein when the pixel circuit performs the threshold voltage sensing operation, the first scanning signal is at low voltage level, the second scanning signal and the third scanning signal are both at high voltage level, the first data signal is at low voltage level, and the source of the third TFT and the source of the fourth receive the threshold voltage sensor.

5. The pixel driving circuit of claim 1, wherein the pixel driving circuit performs a reset operation, a threshold voltage sensing operation, a threshold voltage compensating operation, and a driving operation when the OLED display device is in normal display.

6. The pixel driving circuit of claim 5, wherein when the pixel circuit performs the reset operation, the first scanning signal and the third scanning signal are at high voltage level, the second scanning signal is at low voltage level, and the second data signal is a sum of a reference signal at low voltage level and the threshold voltage signal.

7. The pixel driving circuit of claim 6, wherein when the pixel circuit performs the threshold voltage sensing operation, the first scanning signal and the third scanning signal are at low voltage level, the second scanning signal is at high voltage level, and the second data signal is a sum of the reference signal at low voltage level and the threshold voltage signal.

8. The pixel driving circuit of claim 7, wherein when the pixel circuit performs the threshold voltage compensating operation, the first scanning signal and the third scanning signal are both are low voltage level, the second scanning signal is at high voltage level, and the second data signal is a sum of the display data signal at high voltage level and the threshold voltage signal.

9. The pixel driving circuit of claim 8, wherein when the pixel driving circuit performs the driving operation, the first scanning signal and third scanning voltage are at low voltage level, the second scanning signal at low voltage level, and the second data signal is the sum of the reference signal at low voltage level and the threshold voltage signal.

10. The organic light-emitting diode (OLED) display device comprising the pixel driving circuit as claimed claim 1.

11. The OLED display device of claim 10, wherein the pixel driving circuit performs a reset operation and a threshold voltage sensing operation when the OLED display device is powered off or powered on;
    when the pixel circuit performs the reset operation, the first scanning signal is at low voltage level, the second scanning signal and the third scanning signal are both at high voltage level, the first data signal is at low voltage level, and the source of the third TFT and the source of the fourth TFT receive the initialized signal;
    when the pixel circuit performs the threshold voltage sensing operation, the first scanning signal is at low voltage level, the second scanning signal and the third scanning signal are both at high voltage level, the first data signal is at low voltage level, and the source of the third TFT and the source of the fourth receive the threshold voltage sensor.

12. The OLED display device of claim 10, wherein the pixel driving circuit performs a reset operation, a threshold voltage sensing operation, a threshold voltage compensating operation, and a driving operation when the OLED display device is in normal display;
    when the pixel circuit performs the reset operation, the first scanning signal and the third scanning signal are at high voltage level, the second scanning signal is at low voltage level, and the second data signal is a sum of a reference signal at low voltage level and the threshold voltage signal;
    when the pixel circuit performs the threshold voltage sensing operation, the first scanning signal and the third scanning signal are at low voltage level, the second scanning signal is at high voltage level, and the second data signal is a sum of the reference signal at low voltage level and the threshold voltage signal;

when the pixel circuit performs the threshold voltage compensating operation, the first scanning signal and the third scanning signal are both are low voltage level, the second scanning signal is at high voltage level, and the second data signal is a sum of the display data signal at high voltage level and the threshold voltage signal;

when the pixel driving circuit performs the driving operation, the first scanning signal and third scanning voltage are at low voltage level, the second scanning signal at low voltage level, and the second data signal is the sum of the reference signal at low voltage level and the threshold voltage signal.

* * * * *